US009970648B2

(12) United States Patent
Hong et al.

(10) Patent No.: US 9,970,648 B2
(45) Date of Patent: May 15, 2018

(54) LIGHT SOURCE MODULE, FABRICATION METHOD THEREFOR, AND LIGHTING DEVICE INCLUDING THE SAME

(71) Applicant: LG ELECTRONICS INC., Seoul (KR)

(72) Inventors: Jaepyo Hong, Seoul (KR); Jaechan Kim, Seoul (KR); Injoong Kim, Seoul (KR); Hyeuk Chang, Seoul (KR); Sumin Jun, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days. days.

(21) Appl. No.: 15/153,053

(22) Filed: May 12, 2016

(65) Prior Publication Data

US 2017/0009975 A1    Jan. 12, 2017

(30) Foreign Application Priority Data

Jul. 6, 2015   (KR) .................. 10-2015-0096032
Dec. 14, 2015  (KR) .................. 10-2015-0178666

(51) Int. Cl.
*F21S 4/00*     (2016.01)
*F21V 29/74*    (2015.01)
(Continued)

(52) U.S. Cl.
CPC .............. *F21V 29/74* (2015.01); *H01L 33/64* (2013.01); *H01L 33/647* (2013.01); *H05K 1/053* (2013.01);
(Continued)

(58) Field of Classification Search
CPC . H01L 2224/48091; H01L 2924/00014; H01L 2224/48227; H01L 33/486;
(Continued)

(56) References Cited

U.S. PATENT DOCUMENTS

2006/0097385 A1* 5/2006 Negley ................ H01L 33/486
                                                    257/722
2012/0092833 A1   4/2012 Chang et al.
(Continued)

FOREIGN PATENT DOCUMENTS

EP    2365550 A2   9/2011
EP    2608640 A2   6/2013
(Continued)

*Primary Examiner* — Thien M Le
(74) *Attorney, Agent, or Firm* — Birch, Stewart, Kolasch & Birch, LLP

(57) ABSTRACT

A light source module includes at least one light source, and a body supporting the light source. The body includes a heat sink supporting the light source on a top surface thereof, the heat sink absorbing heat from the light source and dissipating the heat to the outside, an insulating layer provided on at least one surface of the heat sink, the insulating layer having electrical insulating properties, and a conductive layer provided on the insulating layer. The conductive layer includes connection regions through which electric current is supplied to the light source, and a light source region disposed between the connection regions, the light source region having the light source mounted therein. A protective layer is stacked in the connection region. Accordingly, it is possible to obtain effects such as rapid fabrication processes, inexpensive fabrication cost, facilitation of mass production, improvement of product yield, protection of a conductive material, improvement of the lifespan of products, and enhancement of the stability of products.

20 Claims, 11 Drawing Sheets

(51) Int. Cl.
  *H01L 33/64* (2010.01)
  *H05K 1/05* (2006.01)
  H01L 33/62 (2010.01)
  *F21Y 101/02* (2006.01)
  *H05K 3/28* (2006.01)
(52) U.S. Cl.
  CPC ........... *F21Y 2101/02* (2013.01); *H01L 33/62* (2013.01); *H05K 3/28* (2013.01); *H05K 2201/0376* (2013.01); *H05K 2201/10106* (2013.01); *H05K 2201/2054* (2013.01); *H05K 2203/1355* (2013.01)
(58) Field of Classification Search
  CPC ...... H01L 33/60; H01L 33/62; F21Y 2115/10; F21V 19/042; F21V 23/003; F21V 29/70; F21V 29/71; F21V 29/763
  USPC ......................................... 362/249
  See application file for complete search history.

(56) References Cited

U.S. PATENT DOCUMENTS

| | | | | |
|---|---|---|---|---|
| 2012/0120651 | A1* | 5/2012 | Peck | F21S 4/008 362/235 |
| 2012/0120653 | A1* | 5/2012 | Peck | F21S 4/28 362/235 |
| 2013/0016506 | A1* | 1/2013 | Odom, Jr. | A01K 31/18 362/231 |
| 2013/0141905 | A1* | 6/2013 | Hussell | H01L 33/54 362/235 |
| 2013/0301252 | A1* | 11/2013 | Hussell | F21V 29/004 362/184 |
| 2014/0233223 | A1* | 8/2014 | Sharma | F21S 9/02 362/183 |
| 2015/0049483 | A1* | 2/2015 | Lee | G09F 13/22 362/235 |
| 2015/0146422 | A1 | 5/2015 | Kwak et al. | |

FOREIGN PATENT DOCUMENTS

| | | |
|---|---|---|
| KR | 10-0787089 B1 | 12/2007 |
| KR | 10-2009-0001849 A | 1/2009 |
| KR | 10-2011-0129616 A | 12/2011 |
| KR | 10-1101241 B1 | 1/2012 |
| KR | 10-1101709 B1 | 1/2012 |
| KR | 10-2013-0053401 A | 5/2013 |
| KR | 10-2013-0055121 A | 5/2013 |
| KR | 10-2014-0099603 A | 8/2014 |
| KR | 10-2015-0081121 A | 7/2015 |
| KR | 10-2015-0138759 A | 12/2015 |

* cited by examiner

LIGHT SOURCE MODULE, FABRICATION METHOD THEREFOR, AND LIGHTING DEVICE INCLUDING THE SAME

CROSS-REFERENCE TO RELATED APPLICATIONS

The present application claims the benefits of priority to Korean Patent Application No. 10-2015-0178666 filed on 14 Dec. 2015, and 10-2015-0096032 filed on 6 Jul. 2015, which are herein incorporated by reference in their entirety.

BACKGROUND

The present disclosure relates to a light source module, a fabrication method therefor, and a lighting device including the same.

In general, incandescent bulbs or fluorescent lamps are frequently used as indoor or outdoor lighting devices. However, the lifespan of the incandescent bulbs or the fluorescent lamps is short, and therefore, it is necessary to frequently replace the incandescent bulbs or the fluorescent lamps with new ones. The fluorescent lamps can be used for a long period of time as compared with the incandescent bulbs, but are harmful to the environment. In addition, the fluorescent lamps are deteriorated over time, and therefore, the illumination intensity of the fluorescent lamps is gradually reduced.

In order to solve these problems, there has been proposed a light emitting diode (LED) capable of exhibiting excellent controllability, rapid response speed, high electric/light conversion efficiency, long lifespan, low power consumption, high luminance, and emotional lighting. Also, there have been developed various types of lighting modules and lighting devices employing the LED.

The LED is a semiconductor device that coverts electric energy into light. The LED has advantages of low power consumption, semi-permanent lifespan, rapid response speed, safety, and environmental friendly properties as compared with existing light sources such as fluorescent lamps and incandescent bulbs. For these reasons, much research has been conducted to replace the existing light sources with the LED. Furthermore, the LED has been increasingly used as light sources of lighting devices, such as various liquid crystal displays, electric bulletin boards, and streetlights, which are used indoors and outdoors.

A light emitting device (hereinafter, the light emitting device is mainly referred to as an LED, but the present disclosure is not limited thereto) is fabricated in the form of a light source module for improving assembly convenience and protecting the light emitting device from external impact and moisture. In the light source module, a plurality of light emitting devices is integrated with high density, and hence higher luminance can be realized.

Korean Patent Registration No. 10-1472403 filed and registered by the present applicant shows a conventional light source module.

The light source module according to the prior art is fabricated by coupling, to a heat sink, a printed circuit board having a plurality of light emitting devices mounted thereon.

SUMMARY

It is an object of the invention to provide a light source module, a fabrication method therefor, and lighting device including the same with reduced manufacturing efforts and costs. This object is achieved with the features of the claims.

A preferred technical effect or advantage of the light source module is to prevent malfunction caused by a foreign substance or water drop penetrating from the outside and to prevent a conductive material from being oxidized due to contact with air.

A preferred technical effect or advantage of the light source module is that a loss of a portion of light emitted from a light source is avoided.

A preferred technical effect or advantage of the light source module is to avoid that heat generated from the light source is not diffused to the entire heat sink.

A preferred technical effect or advantage of the fabrication method for a light source module to solve a problem in that fabrication time and fabrication cost are excessively required due to a plurality of fabrication processes caused by coupling a printed circuit board to a heat sink and inserting a thermal pad between the printed circuit board and the heat sink.

In one embodiment, there is provided a light source module wherein a conductive layer includes a light source region in which at least one light source is placed and connection regions through which electric current is supplied to the light source, and a protective layer is stacked in the connection region. Such structure allows for a rapid fabrication processes, inexpensive fabrication cost, facilitation of mass production, and improvement of product yield.

The light source module may comprise a heat sink supporting the light source on a top surface thereof, the heat sink absorbing heat from the light source and dissipating the heat to the outside.

The light source module may comprise an insulating layer provided on at least one surface of the heat sink, the insulating layer having electrical insulating properties. The conductive layer may be provided on the insulating layer.

The light source module may comprise connection regions and the light source region being disposed between the connection regions, the light source region having the light source mounted therein.

The light source module may further include a bonding layer.

The protective layer may be provided in a region except the conductive layer on which the bonding layer is provided. In other words, the protective layer may be provided on the insulating layer or the conductive layer.

The protective layer may be provided on the insulating layer and a portion of the conductive layer except the light source region. Also, the protective layer may be provided in only the connection region.

The protective layer may protect the conductive layer from the bonding layer. Specifically, the protective layer may be provided such that only the light source region is opened.

The protective layer may include a reflective material. Accordingly, the protective layer reflects light emitted from the light source, thereby improving the efficiency of the light.

The light source region may comprise a light source mounting part providing a positive electric current and negative electric current to the light source.

The conductive layer may further include a heat dissipation region for transferring heat generated from the light source to the heat sink.

The heat dissipation region may comprise an inner heat dissipation region provided inside the light source region and the connection region; an outer heat dissipation region provided outside the light source region and the connection region; and a bridge connecting the inner heat dissipation region and the outer heat dissipation region to each other.

The protective layer may be stacked in the heat dissipation region.

The protective layer may further be stacked on the insulating layer.

The heat sink may further comprise a heat dissipation fin provided on a bottom surface of the heat sink, the heat dissipation fin dissipating heat to the outside; and an air hole passing through the heat sink.

In another embodiment, a method for fabricating a light source module includes: providing a heat sink; applying an insulating layer on at least one surface of the heat sink; providing a recess part having a metal junction face in the insulating layer; providing a conductive layer in the recess part; applying a protective layer on the conductive layer; and bonding a light source to the conductive layer. Such method allows for a rapid fabrication, inexpensive fabrication cost, facilitation of mass production, and improvement of product yield.

The light source module according to the present disclosure is used in light emitting devices, thereby obtaining much more advantages in industries.

The details of one or more embodiments are set forth in the accompanying drawings and the description below. Other features will be apparent from the description and drawings, and from the claims.

DETAILED DESCRIPTION OF THE EMBODIMENTS

Hereinafter, exemplary embodiments will be described in detail with reference to the accompanying drawings. The technical objective of embodiments is not limited to the aforementioned technical problem, and technical problems not mentioned above can be clearly understood by a person skilled in the art by the disclosure below.

Figure 1:
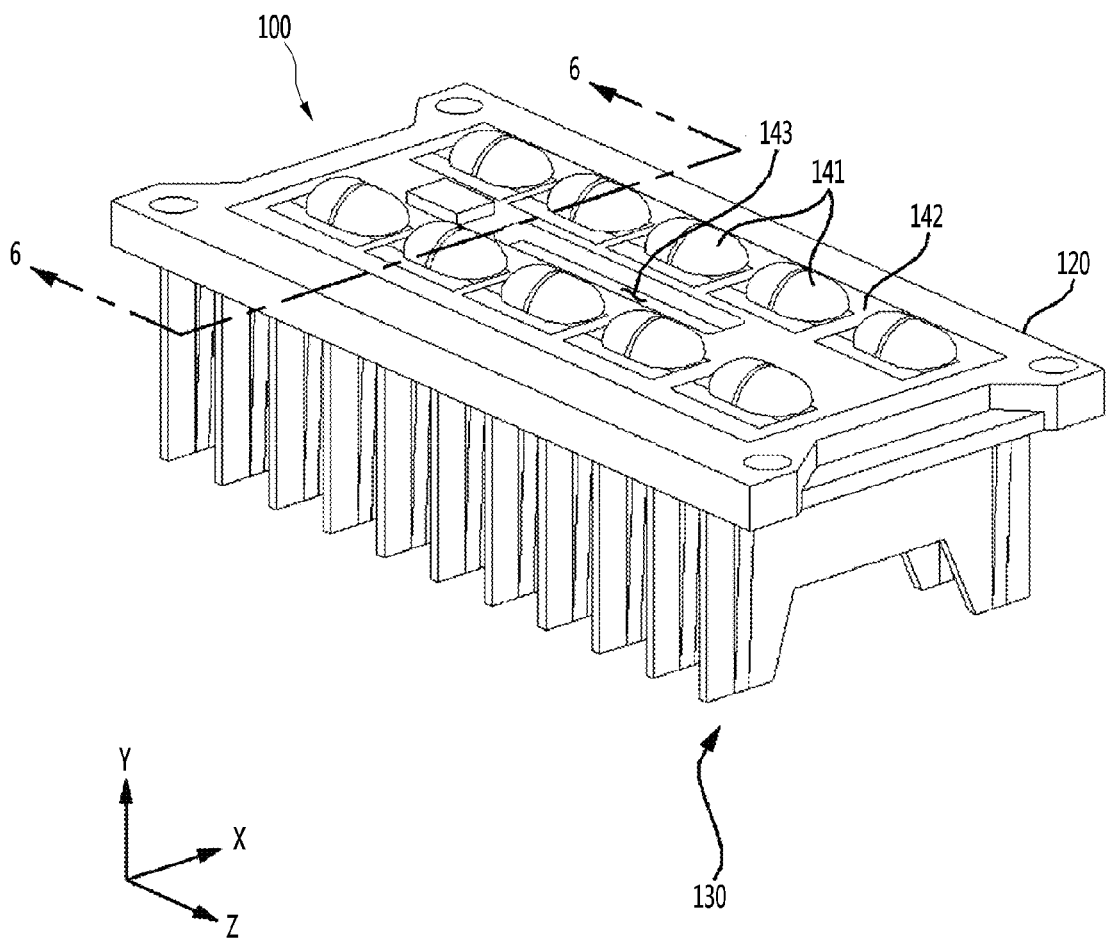
FIG. 1 is a perspective view of a light source module according to a first embodiment.
Figure 2:
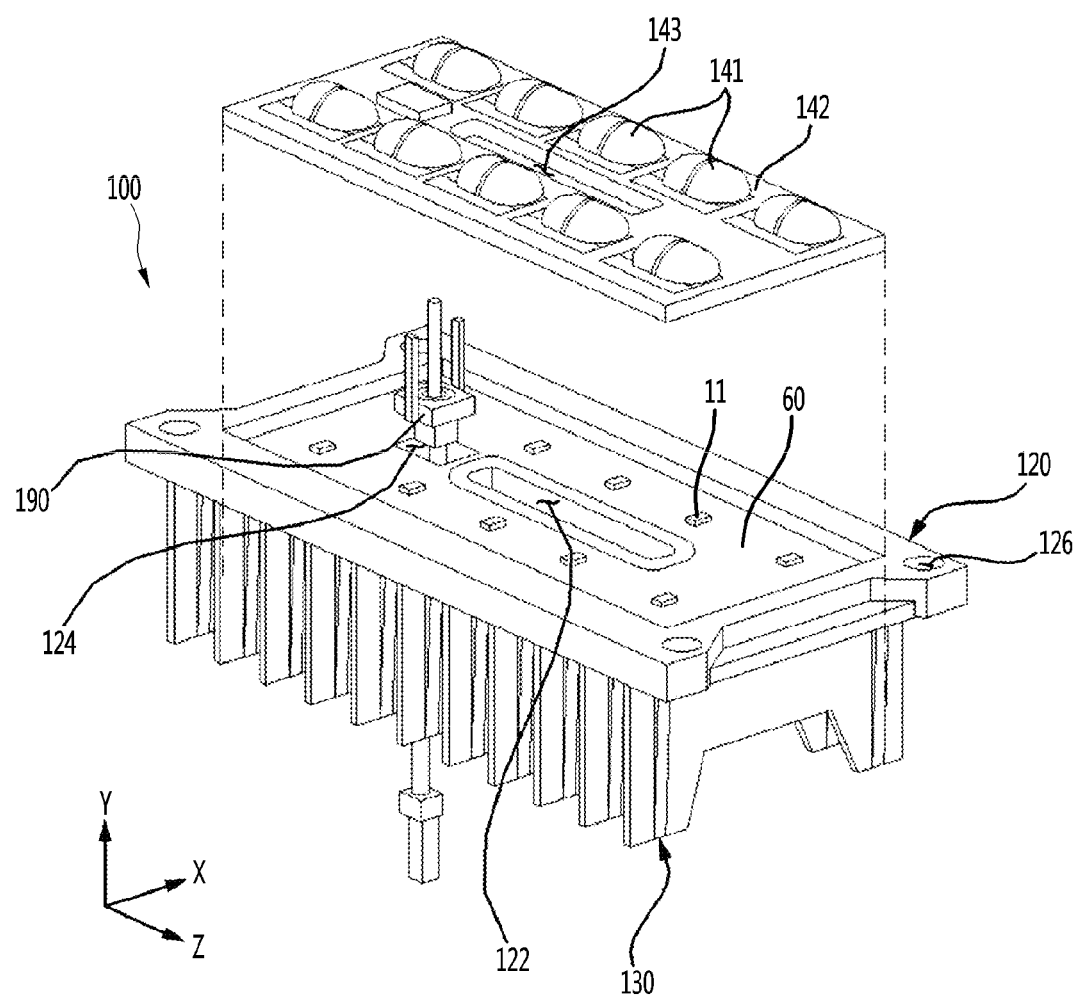
FIG. 2 is an exploded perspective view of the light source module of FIG. 1.

FIG. 1 is a perspective view of a light source module according to a first embodiment. FIG. 2 is an exploded perspective view of the light source module.

Referring to FIGS. 1 and 2, the light source module 100 according to the embodiment may include at least one light source 11 generating light and a body supporting the light source 11.

The light source 11 may include all means that generate light by being supplied with electric energy. For example, the light source 11 may include a light source in the form of a point light source. Specifically, the light source 11 may include any one of a light emitting diode and a laser diode. In the light source 11, a plurality of point light sources emitting light of different colors may be disposed adjacent to each other such that the colors are mixed with each other, thereby emitting light of white or another color.

The body is provided as a part that allows the light source 11 to perform a physical electrical action, so that the light source 11 can be stably operated. The body enables heat generated from the light source 11 to be effectively dissipated. The body is electrically connected to the light source 11 to supply power to the light source 11.

The body may include a heat sink 120. The light source 11 may be fastened to the heat sink 120 through the medium of another member, or may be directly fastened to the heat sink 120. Preferably, the light source 11 may be fastened to the heat sink 120 for the purpose of physical coupling such as support of the weight thereof. However, in order to insulate between the light source 11 and the heat sink 120, the light source 11 may be fastened to the heat sink 120 with a predetermined insulating layer interposed therebetween.

A mounting part 121 (see FIG. 6) on which the light source 11 is mounted may be provided on one surface of the heat sink 120. The mounting part 121 allows heat generated from the light source 11 to be rapidly absorbed into the heat sink 120. When a heat dissipation fin 130 is connected to the other surface of the heat sink 120, the heat sink 120 may transfer, to the heat dissipation fin 130, heat generated from the light source 11 and heat generated by light emitted from the light source 11. It will be apparent that the heat dissipation fin 130 may rapidly dissipate heat to the outside. The heat sink 120 may rapidly dissipate heat to the outside.

The heat sink 120 may be formed of a metal or resin material having excellent heat radiation and heat transfer efficiencies, but the present disclosure is not limited thereto. As an example, the heat sink 120 may be an alloy made of one or two or more selected from the group consisting of aluminum (Al), gold (Au), silver (Ag), copper (Cu), nickel (Ni), tin (Sn), zinc (Zn), tungsten (W), and iron (Fe). As another example, the heat sink 120 may be formed of at least one selected from the group consisting of a resin material such as polyphthalamide (PPA), silicon (Si), aluminum nitride (AlN), photo sensitive glass (PSG), polyamide9T (PA9T), syndiotactic polystyrene (SPS), a metal material, sapphire ($Al_2O_3$), beryllium oxide (BeO), and ceramic. The heat sink 120 may be formed through injection molding, etching, etc., but the present disclosure is not limited thereto.

The heat sink 120 has a plate shape, and may be provided with a quadrangular planar shape. Specifically, the mounting part 121 may be formed by recessing one surface (e.g., an upper surface) of the heat sink 120. A lens cover 142 may be mounted on the mounting part 121. The mounting part 121 may be provided with a waterproof structure with the outside by the lens cover 142. The light source 11 can be waterproofed by coupling between the mounting part 121 and the lens cover 142.

A fastening hole 126 may be formed at an edge of the heat sink 120. When the light source module 100 is coupled to a lighting device, a fastening member passes through the fastening hole 126.

The body may further include the heat dissipation fin 130 and an air hole 122, which improve the heat dissipation efficiency of the heat sink 120.

The heat dissipation fin 130 may have a shape in which the area of the heat dissipation fin 130 contacted with air is maximized. The heat dissipation fin 130 is transferred with heat of the heat sink 120 to be heat-exchanged with external air. Specifically, the heat dissipation fin 130 may be provided in the shape of a plurality of plates further extending downward from the other surface (bottom surface) of the heat sink 120. More specifically, the heat dissipation fin 130 may be disposed in plurality with a predetermined pitch. In addition, the width of the heat dissipation fin 130 may be formed in a region in which it is equal to the width of the heat sink 120 such that heat of the heat sink 120 can be effectively transferred to the heat dissipation fin 130. The heat dissipation fin 130 may be formed with the heat sink 120 as a single body, or may be fabricated as a separate component part. Also, the heat dissipation fin 130 may include a material having excellent heat transfer efficiency, e.g., at least one selected from the group consisting of aluminum (Al), nickel (Ni), copper (Cu), silver (Ag), and tin (Sn). Preferably, the heat dissipation fin 130 may be integrally formed with the heat sink 120 using the same material.

Figure 3:
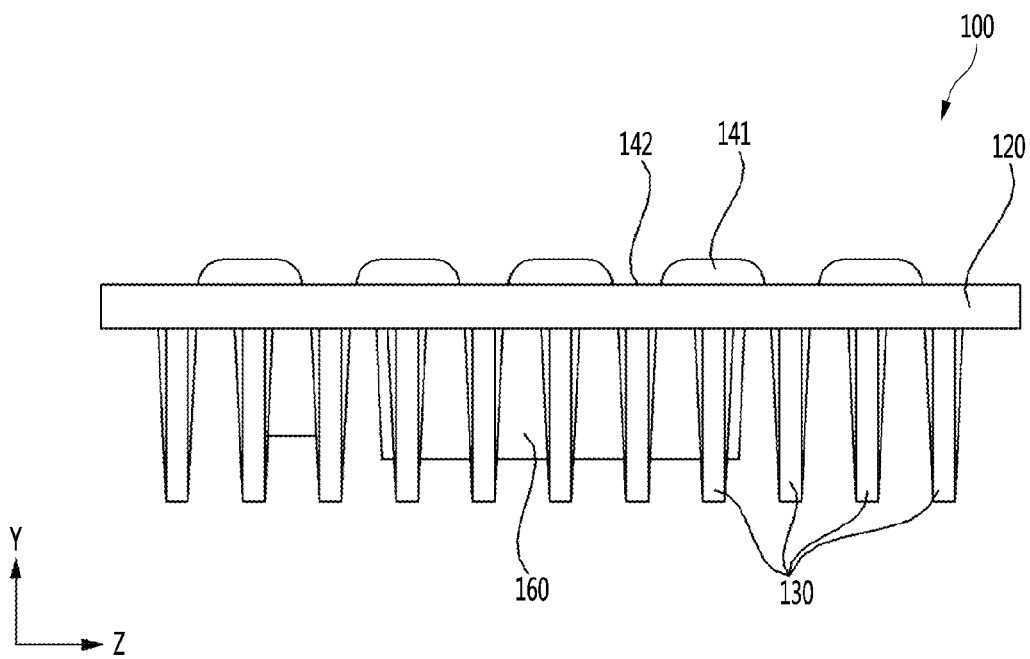
FIG. 3 is a front view of the light source module of FIG. 1.
Figure 4:
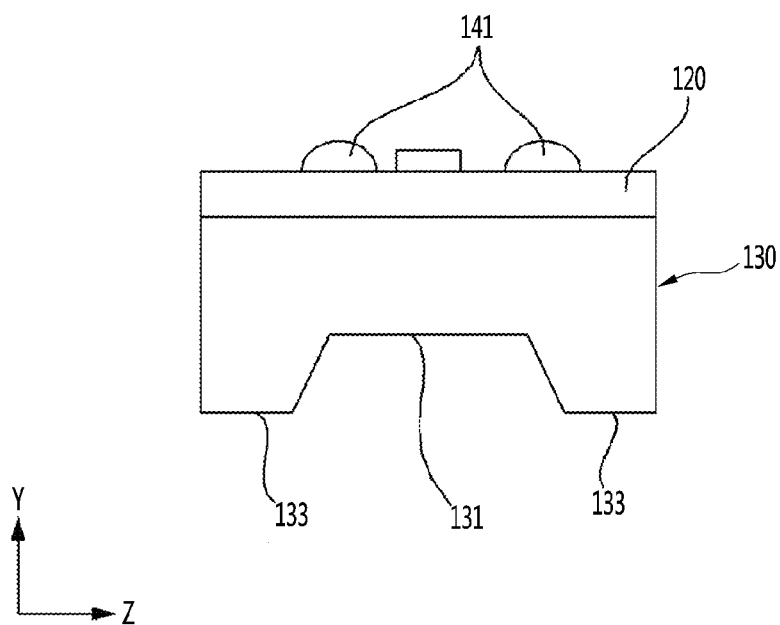
FIG. 4 is a side view of the light source module of FIG. 1.

FIG. 3 is a front view of the light source module. FIG. 4 is a side view of the light source module.

Referring to FIGS. 3 and 4, the heat dissipation fin 130 may be disposed long in the width direction of the heat sink 120. The heat dissipation fin 130 may be disposed in plurality with a predetermined pitch in the length direction of the heat sink 120. A central portion 131 of the heat dissipation fin 130 may be further depressed toward the heat sink 120 than both end portions 133 of the heat dissipation fin 130. Since the light sources 11 are positioned to vertically overlap with both the end portions 133, respectively, both the end portions 133 of the heat dissipation fin 130 are higher than the central portion 131 of the heat dissipation fin 130, and thus the contact area of the heat dissipation fin 130 can be increased. The central portion 131 of the heat dissipation fin 130 may be formed to save fabrication cost.

The air hole 122 (see FIG. 2) may be formed in the heat sink 120. The air hole 122 may be formed to vertically pass through the heat sink 120. Specifically, the air hole 122 may be formed to pass through the heat sink 120 toward the head dissipation fin 130 from the mounting part 121. The air hole 122 may provide a space in which air flows. The air hole 122 may be formed long in the length direction of the heat sink 120 at a central portion of the heat sink 120. The air hole 122 may communicate with a cover hole 143 (see FIGS. 1 and 2) formed in the lens cover 142 while vertically overlapping with the cover hole 143.

The light sources 11 may be positioned at the periphery of the air hole 122. Specifically, the light sources may be disposed adjacent to the air hole 122 on the one surface of the heat sink 120, which forms the periphery of the air hole 122. Therefore, the air hole 122 may be first heated by heat generated from the light sources 11. The air hole 122 may allow air to be circulated by a temperature difference between the inside and outside of the air hole 122. The circulated air may accelerate cooling of the heat dissipation fin 130 and the heat sink 120. Specifically, the air hole 122 may be positioned to vertically overlap the central portion 131 of the heat dissipation fin 130. The light sources 11 may be positioned to respectively overlap both the end portions of the heat dissipation fin 130.

Figure 5:
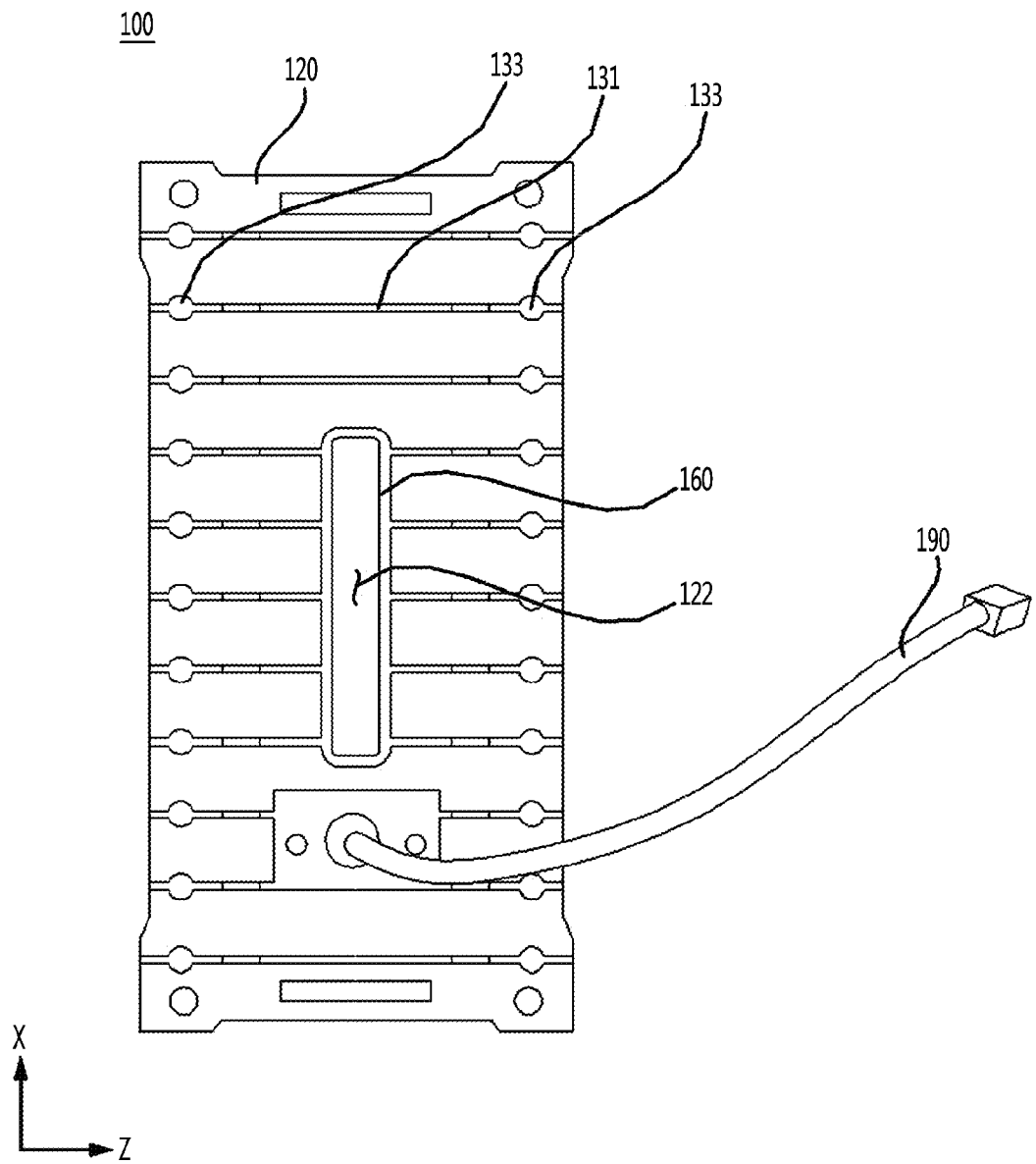
FIG. 5 is a bottom view of the light source module of FIG. 1.

FIG. 5 is a bottom view of the light source module.

Referring to FIG. 5, the light source module 100 may further include an air guiding part 160 extending downward of the heat sink 120 from the circumference of the air hole 122, the air guiding part 160 communicating with the air hole 122 to guide air. (Herein, the term "downward" assumes that the light source is at the top side, and the heat dissipation fins are on the bottom side of the light source module. In general, the air guiding part extends from the side carrying the light source to the side having the heat dissipation fins, irrespective of the final orientation of the light source module). The air guiding part 160 may be formed in the shape of a cylinder having a space therein, and the circumference of the air guiding part 160 may be configured to overlap with the circumference of the air hole 122. That is, the air guiding part 160 may be formed in the shape of a chimney surrounding the air hole 122. The section of the air guiding part 160 may be formed in the shape of a rectangle, and each corner of the rectangle may be curved.

The air guiding part 160 may be made of a material having excellent heat transfer property. For example, the air guiding part 160 may include at least one selected from the group consisting of aluminum (Al), nickel (Ni), copper (Cu), silver (Ag), and tin (Sn). Also, the air guiding part 160 may be formed of at least one selected from the group consisting of a resin material such as polyphthalamide (PPA), silicon (Si), aluminum nitride (AlN), photo sensitive glass (PSG), polyamide9T (PA9T), syndiotactic polystyrene (SPS), a metal material, sapphire ($Al_2O_3$), beryllium oxide (BeO), and ceramic.

The outer surface of the air guiding part 160 is connected to at least portions of a plurality of heat dissipation fins 130, so that heat transferred from the light source 11 to the heat dissipation fin 130 can be transferred to the air guiding part 160. The air guiding part 160 may further accelerate the air flowing into the air hole 122. In addition, a connector hole 124 (see FIG. 2) through which a connector 190 supplying power to the light source 11 passes may be formed in the heat sink 120.

Figure 6:
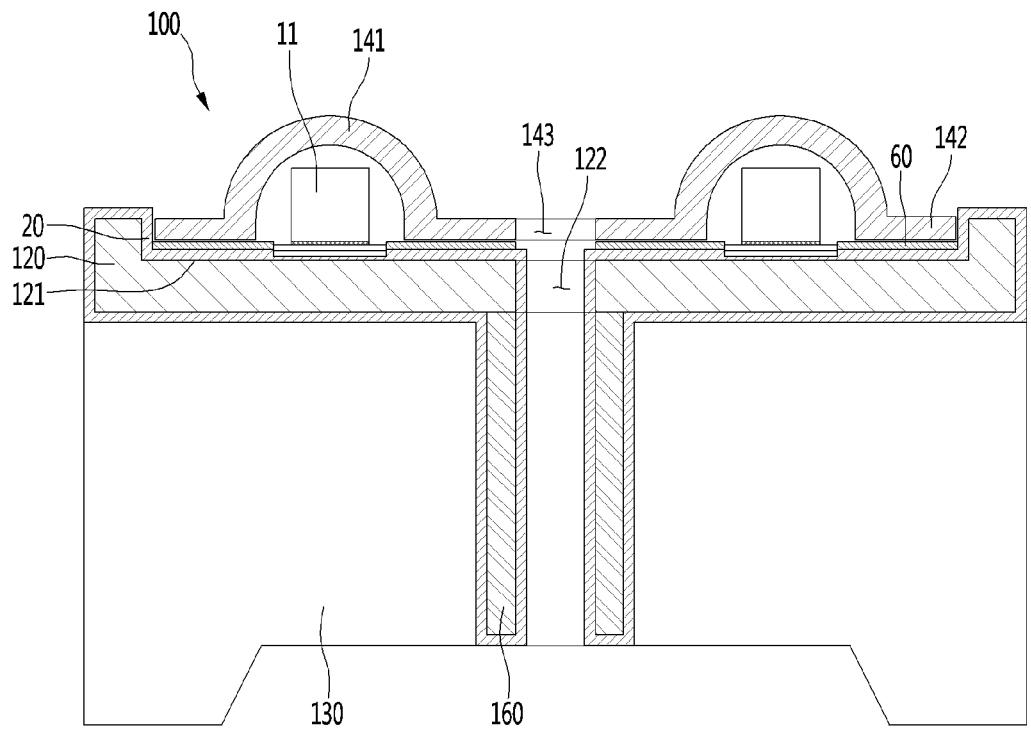
FIG. 6 is a sectional view taken along line 6-6 of FIG. 1.

FIG. 6 is a sectional view taken along line 6-6 of FIG. 1. FIG. 6 is a sectional view taken along a portion at which the light sources 11 are placed, specifically, a portion at which power is applied to the light sources 11.

Referring to FIG. 6, an electrically insulating layer 20 may be entirely formed on a surface of the heat sink 120. When the heat dissipation fin 130 and the air guiding part 160 is formed with the heat sink 120 as a single body, the insulating layer 20 may also be formed on surfaces of the heat dissipation fin 130 and the air guiding part 160. In this case, the heat sink 120, the heat dissipation fin 130, and the air guiding part 160 may be provided together by a die-casting technique, and the insulating layer 20 may be then provided.

The insulating layer 20 may be applied by a powder coating technique. The powder coating technique may be any one of an electrostatic spray technique, an electrostatic brush technique, and a fluidized bed technique. Therefore, the insulating layer 20 may be referred to as a coated insulating layer. Accordingly, a process can be rapidly and inexpensively performed.

The insulating layer 20 may electrically (but not thermally) insulate between the heat sink 120 and a conductive layer 40 which will be described later. The conductive layer 40 has electrical conductivity and hence may be electrically connected to the light source 11. The conductive layer 40 may be a path through which electric current is applied to the light source 11. Also, the conductive layer 40 may have a function of rapidly diffusing heat. To this end, the conductive layer 40 may be made of a metal material. The conductive layer 40 may include at least one selected from the group consisting of Ag, Au, Cu, and Ni.

The light source 11 may be provided as a vertical light emitting diode including two electrodes formed downwardly. If the vertical light emitting diode is mounted on the conductive layer 40, separate wire bonding is not required.

The conductive layer 40 may be provided in a recess part 21 (see FIG. 9) previously formed at a position at which the conductive layer 40 is to be provided. The recess part 21 is a region provided by etching the insulating layer 20 through laser direct structuring (LDS). The recess part 21 may be formed into a structure in which at least the bottom surface in its internal region has a rough surface including a metal core.

The conductive layer 40 may be provided in the recess part 21, to thereby form circuit patterns interconnecting the light sources 11 to the connector hole 124. The conductive layer 40 may be provided by repeatedly performing a plating process at least once. According to an embodiment, in the conductive layer 40, Cu and Ni may be sequentially stacked to respectively provide a first plating layer 41, and a second plating layer 42, which will be described later. With this configuration, heat generated by the light sources 11 transfers easily through the conductive layer 40 and the recess part 21 of the insulating layer 20 to reach the heat sink 120.

The method of providing the insulating layer 20, the recess part 21, and the conductive layer 40 may be performed by forming a conductive film on the insulating layer through techniques such as sputtering and electrolytic/electroless plating using a conductive material such as copper and then etching the conductive film. In this case, the recess part 21 may be previously provided in the insulating layer 20 so as to prevent a short circuit, etc. However, more preferably, the LDS may be performed because fabrication cost is inexpensive, a process can be rapidly and precisely performed, and mass production can be achieved using laser equipment.

The light source module 100 may further include a plurality of lenses 141 that shield the light sources 11 and refract light generated from the light sources 11. The lens 141 may diffuse light generated from the light source 11. The lens 141 may determine the diffusion angle of light generated from the light source 11 according to its shape. For example, the lens 141 may be molded in a concave shape around the light source 11. Specifically, the lens 141 may include a material allowing light to be transmitted therethrough. For example, the lens 141 may be formed of transparent silicon, epoxy, or another resin material. In addition, the lens 141 may surround the light source to protect the light source 11 from external moisture and impact and to isolate the light source 11 from the outside.

More specifically, for convenience of assembly, the lens 141 may be provided to the lens cover 142 formed corresponding to the insulating layer 20. The lens cover 142 may be formed to correspond to the insulating layer 20 on the top surface of the insulating layer 20. The lens 141 positioned at the lens cover 142 may be disposed at a position overlapping the light source 11. The lens cover 142 may be inserted and mounted into the mounting part 121 to waterproof the light source 11 from the outside.

The cover hole 143 communicating with the air hole 122 may be formed in the lens cover 142. Specifically, the cover hole 143 may be formed to vertically pass through the lens cover 142 at the center of the lens cover 142.

The insulating layer 20 may include a material capable of efficiently reflecting light. In this case, light emitted from the light source 11 and light reflected from the lens cover 142 including the lens 141 are again reflected to the outside, thereby further improving the use efficiency of light. Further, light lost as heat is reduced, thereby achieving high heat dissipation efficiency.

Figure 7:
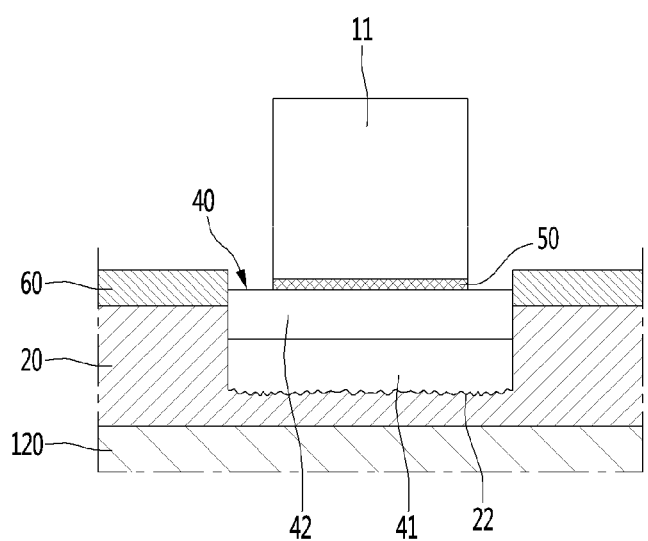
FIG. 7 is an enlarged view of a portion at which a light source is placed in FIG. 1.

FIG. 7 is an enlarged view of a portion at which a light source is placed.

Figure 9:
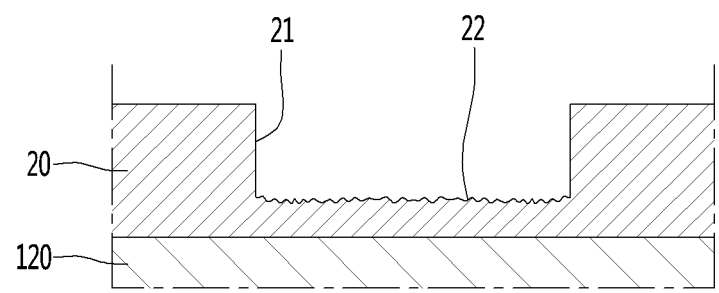

Referring to FIG. 7, a metal junction face 22 may be processed in an inner surface of the recess part 21 (see FIG. 9). In the metal junction face 22, laser is irradiated onto a plating target region, so that a surface of the insulating layer 20 can be processed as a surface having a property suitable for plating. The metal junction face 22 may be provided with a metal core, or may be processed as a lattice-shaped trench. The metal junction face 22 may include at least the bottom surface of the recess part 21.

The conductive layer 40 may be stacked on the metal junction face 22. At least one plating layer may be stacked in the conductive layer 40. For example, the conductive layer 40 may include the first plating layer 41 made of copper and the second plating layer 42 made of nickel. The first plating layer 41 may be stacked to a thickness of 10 to 20 μm, and the second plating layer 42 may be stacked to a thickness of 5 to 15 μm. In addition, a third plating layer (not shown) made of gold may be stacked to a thickness of 0.1 μm or so on the second plating layer 42. However, the third plating layer (not shown) may cause an increase in material cost. Therefore, in this embodiment, it will be described that the third plating layer (not shown) is not stacked.

The first plating layer 41 placed at the lowermost side of the conductive layer 40 serves as an electroconductive functional layer that can reduce the amount of heat generation by reducing electrical resistance. To this end, the first plating layer 41 may be made of copper. In order to ensure sufficient electrical conductivity, the first plating layer 41 may be formed thickest among the plating layers. The first plating layer 41 may be made of a metal having a high electrical conductivity as well as the copper.

The second plating layer 42 placed on the surface of first plating layer 41 serves as a soldering functional layer that improves the quality of soldering. In order to perform soldering, it is necessary for a melted solder to be well wettable on the entire surface of a base material and to be well spread on the surface of the base material. The second plating layer 42 may be made of nickel as a metal for ensuring characteristics of the soldering.

A bonding layer 50 may be provided on the conductive layer 40. The light source 11 may be placed on the bonding layer 50. The bonding layer 50 may include a low-temperature solder paste with which soldering can be performed at a low temperature. For example, the bonding layer 50 may include OM525. The bonding layer 50 may be provided by allowing the low-temperature solder paste to pass through a reflow machine in a state in which a light emitting device is mounted on the low-temperature solder paste. The soldering is performed at the low temperature, so that it is possible to prevent separation between the heat sink 120 and the insulating layer 20 and separation between the insulating layer 20 and the conductive layer 40.

A protective layer 60 may be provided on the conductive layer 40. The protective layer 60 may be provided in a region except the conductive layer 40 on which the bonding layer 50 is provided. In other words, the protective layer 60 may be provided on the insulating layer 20 or the conductive layer 40.

The protective layer 60 can prevent the conductive layer 40 from being oxidized. Also, the protective layer 60 can prevent a foreign substance, a water drop, or the like from penetrating into the conductive layer 40. Also, the protective layer 60 can protect the conductive layer 40 from external impact.

The protective layer 60 may include an insulating material. For example, the protective layer 60 may include a solder resist, an epoxy material, a nano insulating coating material, a flexible composite insulating material, an organic material, an insulating permanent coating material, a polycarbonate material, a resin material, etc. However, in this embodiment, it will be described that the protective layer 60 is a solder resist.

FIGS. 8 to 13 are views sequentially illustrating a fabrication method of the light source module.

Figure 8:
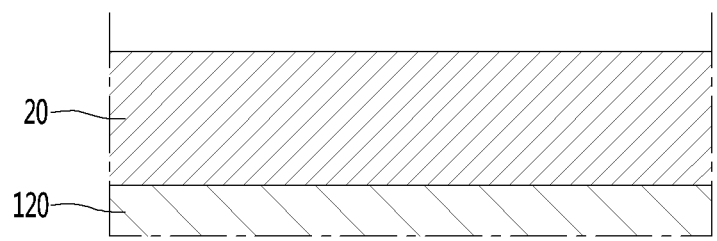
FIGS. 8 to 13 are views sequentially illustrating a fabrication method of the light source module.

First, referring to FIG. 8, the insulating layer 20 may be provided to a body fabricated by, for example, a die-casting technique. The insulating layer 20 may be applied by a powder coating technique. The powder coating technique may be any one of an electrostatic spray technique, an electrostatic brush technique, and a fluidized bed technique. Therefore, the insulating layer 20 may be referred to as a coated insulating layer. The thickness of the coated insulating layer may be 60 to 80 μm. However, the thickness is not limited thereto, and may be selected to have various dimensions according to insulation performance, heat dissipation performance, and process variables. In an embodiment, a condition may be found in which, when the light source 11 is a light emitting diode and is connected to a commercial power source, the insulation and heat dissipation of the insulating layer 20 can be ensured, and the providing of the insulating layer 20 can be performed through an inexpensive process.

The LDS may be applied to the insulating layer 20 such that the conductive layer 40 is plated on at least one portion of the surface of the insulating layer 20. The LDS is a process performed before a plating process, and refers to a process of irradiating laser onto a plating target region of the surface of the insulating layer 20, so that a plating target region of the surface of a resin molded article is reformed to have a property suitable for plating. To this end, the insulating layer 20 may contain a 'core generating agent for LDS' (hereinafter, simply referred to as a 'core generating agent') capable of forming a metal core by means of laser, or may have a predetermined pattern formed therein such that a plating layer is provided at the inner surface of the recess part 21.

First, a case where the insulating layer 20 contains a core generating agent will be described.

A core generating agent may be contained in the resin molded article providing the insulating layer 20. If laser is irradiated onto the core generating agent, a metal core may be generated as the core generating agent is decomposed. In addition, the plating target region onto which the laser is irradiated may have a surface roughness. The plating target region reformed by the laser can be suitable for plating due to the metal core and the surface roughness. The metal core may mean a core with which a metal is joined in a subsequent plating process.

The core generating agent may include a metal oxide having a spinel, a heavy metal composite oxide spinel such as copper chromium oxide spinel, a copper salt such as copper hydroxide phosphate, copper phosphate, copper sulfate, or cuprous thiocyanate, and the like. A polyester-based resin may be used as the resin molded article. Since the polyester-based resin has better adhesion with a metal, it is possible to prevent separation between the heat sink 120 and the insulating layer 20 and separation between the insulating layer 20 and the conductive layer 40, which may occur in a bonding process of the light source 11 as a subsequent process.

A case where a predetermined pattern is formed in the inner surface of the recess part 21 will be described in detail. Although the resin molded article does not contain the core generating agent, the conductive layer 40 may be provided by forming a trench line with a predetermined pattern arrangement in the plating target region. The plating process may be performed on the trench line by effectively promote the joining of a metal with the plating target region on the surface of the resin molded article. The trench line may be provided with at least two kinds of trenches intersecting each other.

The forming of the trench line with the predetermined pattern arrangement may be performed by irradiating laser onto the plating target region of the surface of the resin molded article.

FIG. 9 is a view illustrating that the recess part is provided in the insulating layer.

Referring to FIG. 9, laser may be used as a means for providing the recess part 21 in the insulating layer 20. A medium providing the laser may include, for example, yttrium aluminum garnet (YAG), yttrium orthovanadate ($YVO_4$), ytterbium (YB), $CO_2$, etc. The wavelength of the laser may be, for example, 532 nm, 1064 nm, 1090 nm, 9.3 μm, 10.6 μm, etc. An algorithm in which processing is performed by recognizing a three-dimensional (3D) shape may be used when the processing is performed using the laser. For example, a method may be applied in which the processing height of the laser is controlled by recognizing a 3D-shaped component part using a 3D recognition program and separating the component part into several levels for every height. Outer line processing may be additionally performed to achieve plating uniformity between a non-processing surface and a plating surface formed by processing the metal junction face 22 using laser. The output value of the laser may be, for example, about 2 W to 30 W.

The metal junction face 22 processed by the laser has the metal core, the rough surface, and the trench, so that the conductive layer 40 can be plated in a subsequent process.

Figure 10:
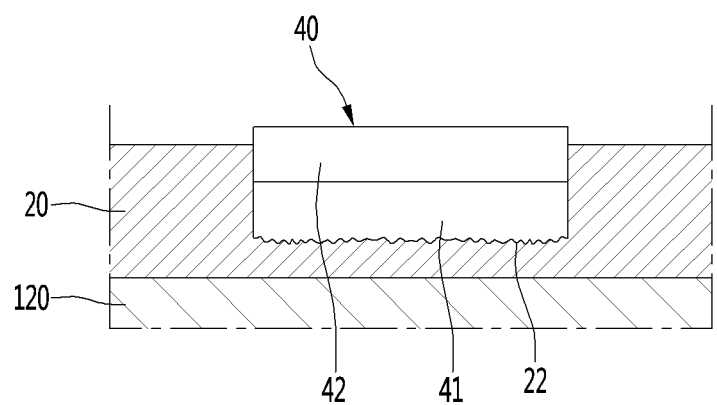

FIG. 10 is a view illustrating that the conductive layer is provided in the recess part. In the example shown in FIG. 10, the conductive layer 40 has two stacked layers 41 and 42.

Referring to FIG. 10, the conductive layer 40 may be provided by plating a metal on the metal junction face 22 using an electroless process. It will be apparent that another plating process may be performed. The conductive layer 40 may be copper, nickel, gold, silver, or a combination thereof. The conductive layer 40 may be a single-layered or stacked structure. In the stacked structure, layers may be the same metal or different metals. In this embodiment, it is illustrated that layers of copper and nickel are sequentially stacked.

As an embodiment, a case where the first plating layer 41 made of copper is provided will be described in detail. The heat sink 120 providing the metal junction face 22 is immersed in an electroless copper plating solution. In this case, the heat dissipation fin 130 and the air guiding part 160 may be immersed together with the heat sink 120. For example, an aqueous plating solution for electroless copper may contain about 55 ml to about 65 ml of a copper dry bathing/supplementing agent, about 55 ml to about 65 ml of an alkaline supplementing agent, about 15 ml to about 20 ml of a complexing agent, about 0.1 ml to about 0.2 ml of a stabilizing agent, and about 8 ml to about 10 ml of formaldehyde, based on deionized water.

The copper dry bathing/supplementing agent may contain, for example, about 6 parts by weight to about 12 parts by weight of copper sulfate, about 1 part by weight to about 1.5 parts by weight of polyethylene glycol, about 0.01 part by weight to about 0.02 part of weight of the stabilizing agent, and about 78 parts by weight to about 80 parts by weight of water.

The alkaline supplementing agent may contain, for example, about 40 parts by weight to about 50 parts by weight of sodium hydroxide, about 0.01 part by weight to about 0.02 part by weight of the stabilizing agent, and about 50 parts by weight to about 60 parts by weight of the water.

The complexing agent may contain, for example, about 49 parts by weight to about 50 parts by weight of the sodium hydroxide, about 0.01 part by weight to about 0.02 part by weight of the stabilizing agent, and about 50 parts by weight to about 51 parts by weight of the water.

The stabilizing agent may contain, for example, about 0.2 part by weight to about 0.3 part by weight of potassium selenocyanate, about 5 parts by weight to about 6 parts by weight of potassium cyanide, about 0.3 part by weight to about 0.4 part by weight of the sodium hydroxide, and about 92 parts by weight to about 93 parts by weight of the water.

For example, in order to provide the first plating layer 41 made of copper, a resin molded article provided with a catalyst may be immersed at a deposition speed of about 0.5 to about 0.7 μm/10 min in the electroless copper solution at about 41° C. to about 55° C. and then washed by water.

The conductive layer 40 may be stacked up to a range exceeding the depth of the recess part 21. Accordingly, the resistance of the conductive layer 40 can be reduced, and the heat conduction amount of the conductive layer 40 can be increased, thereby improving heat dissipation performance. It will be apparent that the present disclosure is not limited to the above-described configuration.

Figure 11:
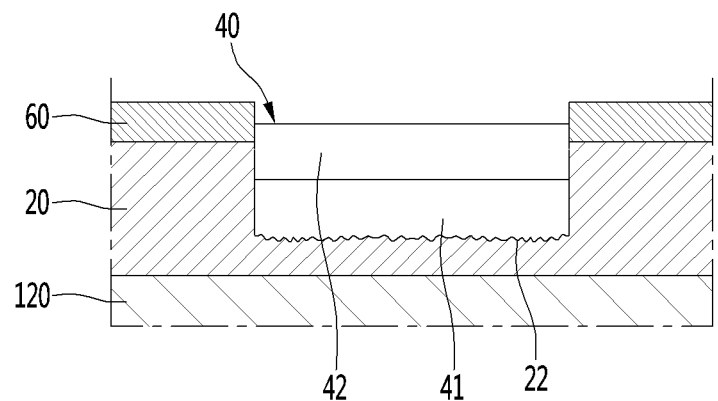

FIG. 11 is a view illustrating that the protective layer 60 is provided.

Referring to FIG. 11, the protective layer 60 may be applied on the conductive layer 40 and the insulating layer 20. Also, the protective layer 60 may be applied on the entire upper surface of the heat sink 120. However, a light source region 200 (see FIG. 14) in which the light source 11 is mounted may be opened by etching the conductive layer 40, as shown in FIG. 11. The light source region 200 may be referred to as a partial region of the conductive layer 40, in which the light source 11 is mounted.

In another aspect, the protective layer 60 may be provided on the conductive layer 40 except the partial region of the conductive layer 40, in which the light source 11 is to be mounted. However, the present disclosure is not limited to the above-described configuration.

In this embodiment, it will be described that the protective layer 60 is applied on the conductive layer 40 and the insulating layer 20 and then etched such that the light source region 200 is opened.

The protective layer 60 may include an insulating material. For example, the protective layer 60 may include a solder resist, an epoxy material, a nano insulating coating material, a flexible composite insulating material, an organic material, an insulating permanent coating material, a polycarbonate material, a resin material, etc. However, in this embodiment, it will be described that the protective layer 60 is a solder resist.

A process of stacking the protective layer 60 will be described. The protective layer 60 may be applied on the entire surface of the conductive layer 40 and the insulating layer 20.

A technique for applying the protective layer 60 may include a silk screen printing technique, a photo solder resist (PSR) printing technique, etc. For example, the protective layer 60 may be applied by performing a process of applying an IR ink corresponding to a thermosetting resin composition and then heat-drying and curing the IR ink. Also, the protective layer 60 may be applied by performing a process of applying a UV ink corresponding to an ultraviolet setting resin composition and then drying and curing the UV ink through irradiation of ultraviolet light. Also, the protective layer 60 may be applied by entirely applying a PSR ink and then performing processes including exposure, developing, UV drying (curing), and the like, in addition to a process of heat-drying the ink.

After the protective layer 60 is applied, an etching process may be performed to remove the protective layer 60 applied on the light source region 200. For example, the etching process may be at least one of a plasma etching process, a wet etching process, and a reactive ion etching process. If the etching process is performed, the protective layer 60 may be provided such that the light source region 200 is opened.

Figure 12:
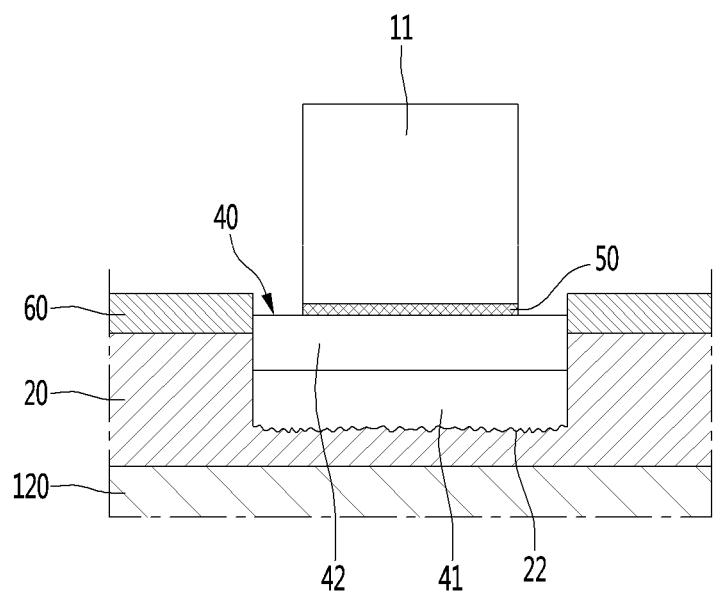

FIG. 12 is a view illustrating that the bonding layer is provided.

Figure 14:
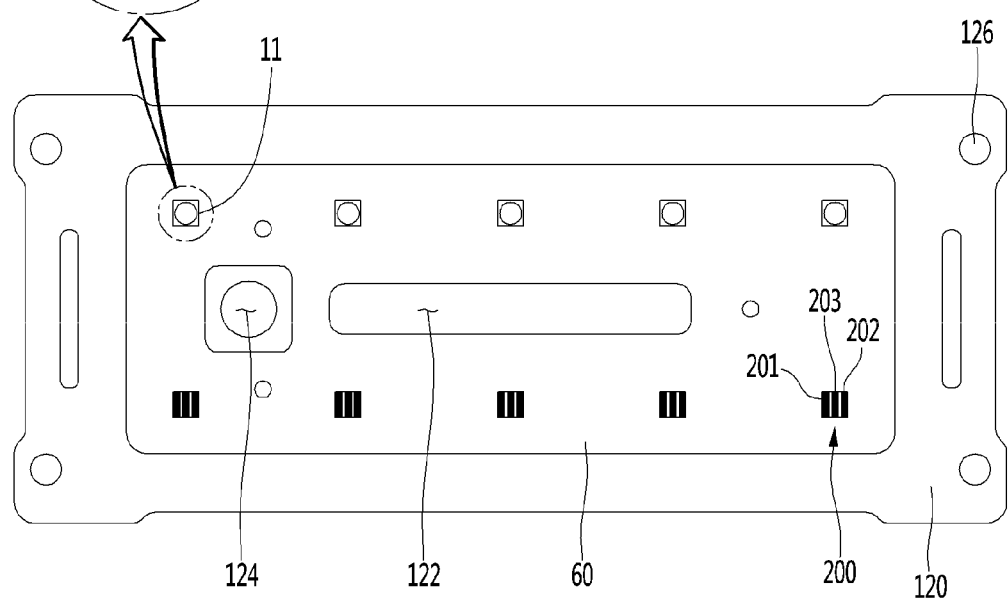
FIG. 14 is a plan view of the light source module of FIG. 1.

Referring to FIG. 12, the bonding layer 50 may be provided in the light source region 200 (see FIG. 14). In other words, the bonding layer 50 may be provided on the conductive layer 40 on which the light source 11 is to be mounted. The bonding layer 50 may electrically connects the light source 11 and the conductive layer 40 to each other.

The bonding layer 50 may be provided by applying a low-temperature solder paste on the conductive layer 40 on which the light source 11 is to be mounted, mounting the light source 11 at a position at which the electrodes of the light source 11 are aligned on the low-temperature solder paste, and then allowing the low-temperature solder paste to pass through a reflow machine. In the reflow process, an unnecessary portion is removed from the low-temperature solder paste, and a conductive element remains, so that the conductive layer 40 and the light source 11 can be electrically connected to each other.

The low-temperature solder paste may include OM525 available at about 160° C. Since a relatively low temperature atmosphere is formed in the reflow process, it is possible to prevent separation between the insulating layer 20 and the heat sink 120 and separation between the conductive layer 40 and the insulating layer 20.

Figure 13:
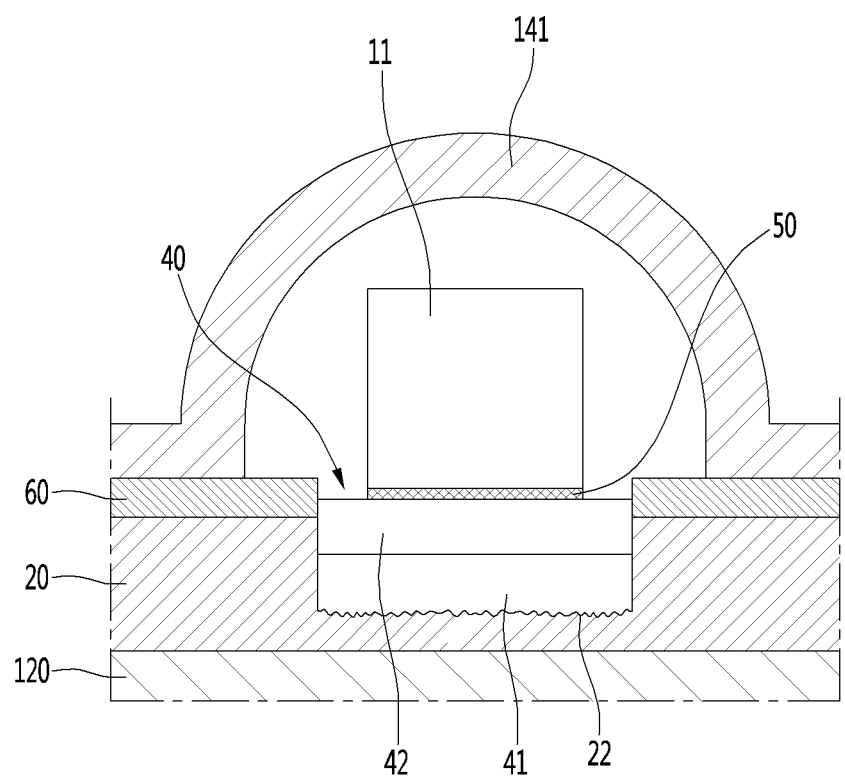

FIG. 13 is a view illustrating that the lens is further provided over the light source.

Referring to FIG. 13, the lens 141 may be provided over the light source 11. The lens 141 may shield the light source 11. Also, the lens 141 may refract and diffuse light generated from the light source 11. The lens 141 may determine the diffusion angle of light generated from the light source 11 according to its shape. For example, the lens 141 may be molded in a concave shape around the light source 11. Specifically, the lens 141 may include a material allowing light to be transmitted therethrough. For example, the lens 141 may be formed of transparent silicon, epoxy, or another resin material. In addition, the lens 141 may surround the light source to protect the light source 11 from external moisture and impact and to isolate the light source 11 from the outside.

More specifically, for convenience of assembly, the lens 141 may be disposed at the lens cover 142 formed corresponding to the insulating layer 20. Also, the lens 141 may be disposed at the lens cover 142 formed corresponding to the protective layer 60 provided on the insulating layer 20 or the conductive layer 40. The lens cover 142 may be formed to correspond to the insulating layer 20 on the top surface of the insulating layer 20. The lens 141 positioned at the lens cover 142 may be disposed at a position overlapping the light source 11. The lens cover 142 may be inserted in the mounting part 121 to waterproof the light source 11 from the outside. Also, the lens cover 142 may be fastened to the heat sink 120 through a fastening member to waterproof the light source 11 from the outside.

Figure 15:
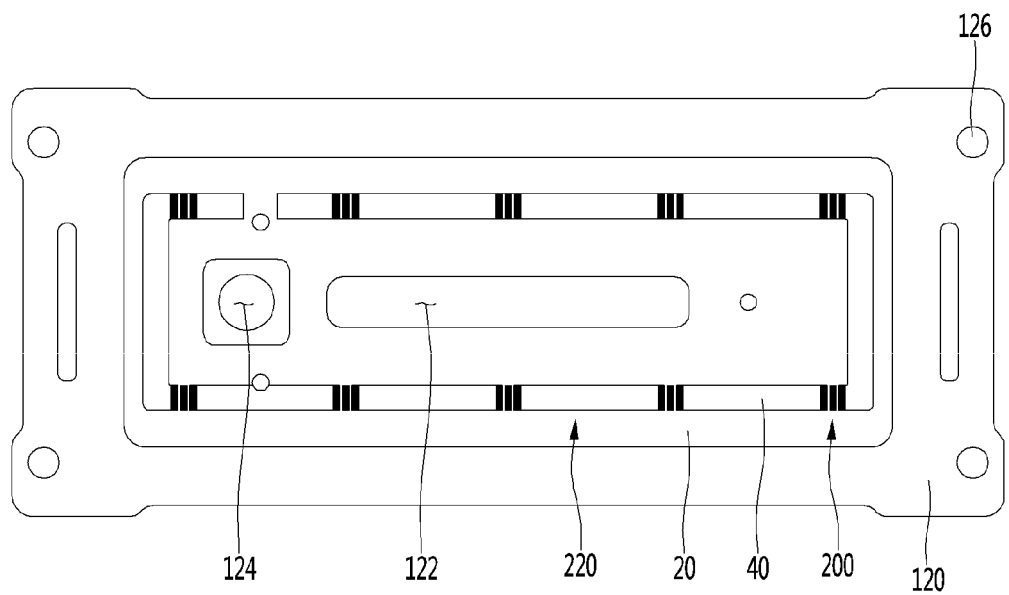
FIG. 15 is a plan view illustrating a state in which any protective layer is not provided in the light source module of FIG. 14.

FIG. 14 is a plan view of the light source module of FIG. 1, which illustrates a state in which the lens cover is omitted. FIG. 15 is a plan view illustrating a state in which any protective layer is not provided in the light source module of FIG. 14.

Referring to FIGS. 14 and 15, the mounting part 121 (see FIG. 6) on which the light source 11 is mounted may be formed on the top surface of the heat sink 120. The mounting part 121 may be provided by being recessed in the direction of bottom surface of the heat sink 120.

The mounting part 121 may be provided with the insulating layer 20 having electrically insulating properties, the conductive layer 20 provided in the recess part 21 (see FIG. 9) of the insulating layer 20, and the protective layer 60 protecting the insulating layer 20 and the conductive layer 40. In other words, the protective layer 60 may be provided on the entire surface of the insulating layer 20 and the conductive layer 40, which are provided in the mounting part 121. Also, the protective layer 60 may be provided on only a portion of the conductive layer 40. However, the present disclosure is not limited to the above-described configuration. In this embodiment, it will be described that the protective layer 60 is provided on the conductive layer 40 and the insulating layer 20.

The conductive layer 40 may include the light source region 200 in which the light source 11 is mounted and a connection region (see 220 of FIG. 15) provided to supply electric current to the light source 11. The light source region 200 may be referred to as a region in which the light source 11 is placed on the conductive layer 40.

The light source region 200 may be provided to face the light source 11. Specifically, the bottom surface of the light source 11 may include a positive electrode face 12 to which a positive electric current is applied, a negative electrode face 13 to which a negative electric current is applied, and a heat dissipation face 14 that transfers heat generated from the light source 11. The faces may be formed to be spaced apart from each other. Therefore, the light source region 200 may include a first light source mounting part 201 facing the positive electrode face 12 and a second light source mounting part 202 facing the negative electrode face 13. Also, the light source region 200 may include a third light source mounting part 203 facing the heat dissipation face 14. The third light source mounting part 203 may not be provided. However, the present disclosure is not limited to the above-described configuration. In this embodiment, it will be described that the third light source mounting part 203 is provided.

The first light source mounting part 201 and the second light source mounting part 202 may apply electric current to the light source 11. Specifically, if a "positive electric current" is applied to the first light source mounting part 201, a "negative electric current" may be applied to the second light source mounting part 202. The third light source mounting part 203 may transfer heat generated from the light source 11 to the heat sink 120.

The connection region 220 may connect different light sources 11 to each other. Also, the connection region 220 may supply, to the light source 11, power applied from a power source part (not shown). Therefore, the connection region 220 may be provided as a straight conducting path connected to supply electric current to the light source 11. In addition, the connection region 220 may be provided in a pattern repeated in a certain shape, a curved line, a shape having different thicknesses, or the like. However, the present disclosure is not limited to the above-described configuration. In this embodiment, it will be described that the connection region 220 is provided as a straight conducting path through which electric current is applied to the light source 11.

The protective layer 60 may be provided on the conductive layer 40 and the insulating layer 20. However, the light source region 200 may be opened such that the light source 11 is mounted therein. The protective layer 60 may be provided on the insulating layer 20 and a portion of the conductive layer except the light source region 200. Also, the protective layer 60 may be provided in only the connection region 220. However, the present disclosure is not limited to the above-described configuration. In this embodiment, it will be described that the protective layer 60 is provided on the conductive layer 40 and the insulating layer 20, and the light source region 200 is opened such that the light source 11 is mounted therein.

The protective layer 60 may include an insulating material. For example, the protective layer 60 may include a silicon material, a solder resist, an epoxy material, a nano insulating coating material, a flexible composite insulating material, an organic material, an insulating permanent coating material; a polycarbonate material, a resin material, etc. However, in this embodiment, it will be described that the protective layer 60 is a solder resist.

The solder resist may include a permanent (petroleum) compound, an epoxy resin, a phenol-based hardener, and hardening accelerator.

The protective layer 60 may protect the conductive layer 40 from the bonding layer 50 (see FIG. 7). Specifically, the protective layer 60 may be provided such that only the light source region 200 is opened. According to the above-described configuration, the protective layer 60 can guide a region in which the bonding layer 50 may be melted and flow down when the light source 11 and the conductive layer 40 are coupled to each other. Thus, it is possible to prevent malfunction of the light source 11 as the bonding layer 50 flows down on the conductive layer 40. Further, it is possible to provide a neat external appearance.

The protective layer 60 can protect the conductive layer 40 from a foreign substance, a water drop, an insect, etc., penetrating from the outside. Specifically, if high-temperature heat is generated from the light source 11, thermal deformation of the conductive layer 40 or chemical reaction of a conductive material may be accelerated. For example, when the conductive layer 40 is made of copper, the copper is oxidized when it comes in contact with water or air. Therefore, the copper may be corroded or discolored. When the conductive layer 40 is made of nickel, a harmful material may be generated. In addition, the conductive layer 40 may cause a problem of corrosion or overload through a foreign substance or pollutant penetrating from the outside. Accordingly, if the protective layer 60 is provided on the conductive layer 40, the conductive layer 40 can be protected, and thus it is possible to prevent a problem caused by corrosion. Further, the lifespan of products can be increased by preventing overload. Moreover, it allows for a rapid fabrication processes, inexpensive fabrication cost, facilitation of mass production, and improvement of product yield.

The second embodiment is characterized in that any specific portion is deformed in the first embodiment. Therefore, in the second embodiment, description of the first embodiment will be applied to portions identical to those of the first embodiment.

Figure 16:
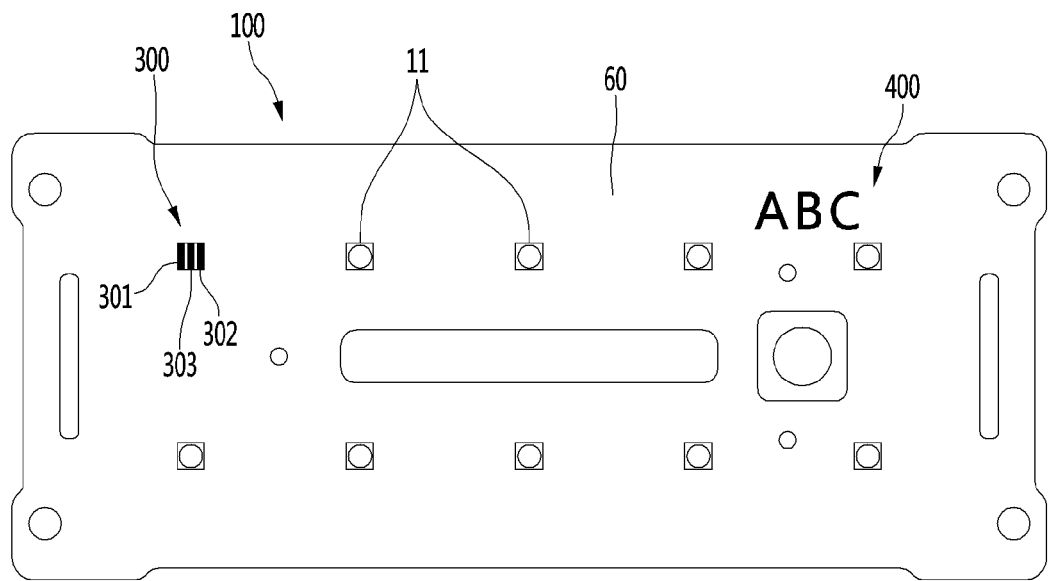
FIG. 16 is a plan view of a light source module according to a second embodiment.
Figure 17:
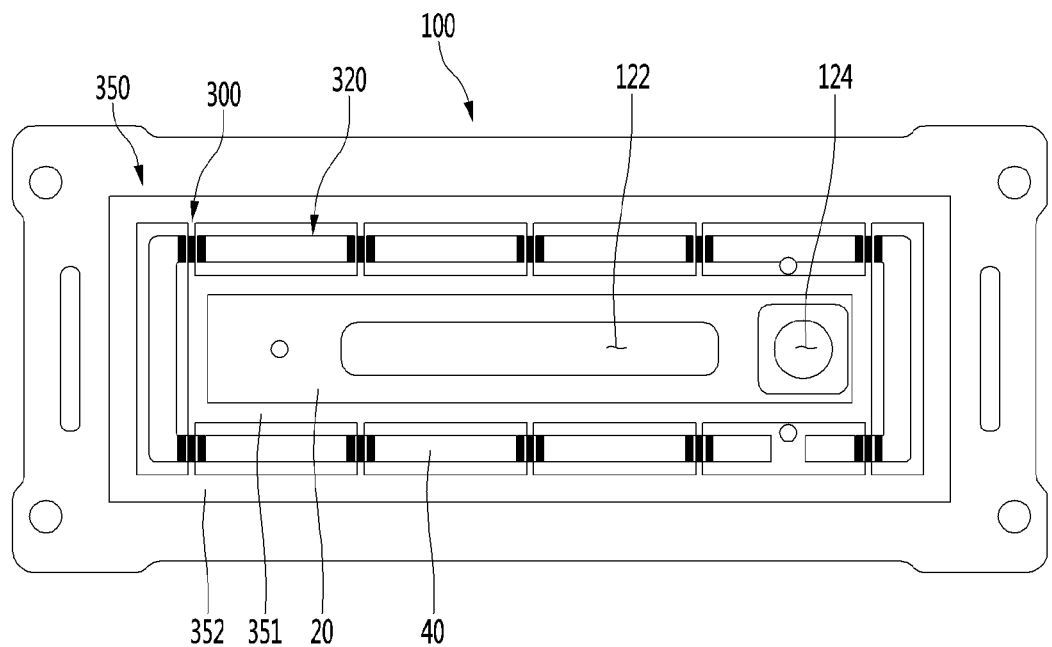
FIG. 17 is a plan view illustrating a state in which any protective layer is not provided in the light source module of FIG. 16.

FIG. 16 is a plan view of a light source module according to a second embodiment. FIG. 17 is a plan view illustrating a state in which any protective layer is not provided in the light source module of FIG. 16.

Referring to FIGS. 16 and 17, the insulating layer 20 having electrically insulating properties and the conductive layer 40 capable of supplying power to the light source 11 may be provided on the heat sink 120. That is, the mounting part 121 (see FIG. 6) is not provided in the heat sink 120, and the insulating layer 20 and the conductive layer 40 may be directly provided on the heat sink 120. However, the present disclosure is not limited to the above-described configuration.

The conductive layer 40 may be provided in the recess part 21 (FIG. 9) formed in the insulating layer 20. The conductive layer 40 may include a light source region 300 in which the light source 11 is mounted, a connection region 320 through which power is applied to the light source 11, and a heat dissipation region 350 formed to be spaced apart from the connection region 320.

The heat dissipation region 350 may transfer heat generated from the light source 11 to the heat sink 120. Also, the heat dissipation region 350 may be provided such that the light source region 300 and the connection region 320 are not electrically connected to each other. Also, the heat dissipation region 350 may be provided on the insulating layer 20 except regions in which the light source region 300 and the connection region 320 are provided. However, the present disclosure is not limited to the above-described configuration.

The heat dissipation region 350 may include an inner heat dissipation region 351 provided inside the light source region 300 and the connection region 320, and an outer heat dissipation region 352 provided outside the light source region 300 and the connection region 320.

The light source region 300 may include a first light source mounting part 301 applying a positive electric current to the light source 11, a second light source mounting part 302 applying a negative electric current to the light source 11, and a third light source mounting part 303 transferring heat generated from the light source 11 to the heat sink 120.

The third light source mounting part 303 may be provided to be spaced apart from the first light source mounting part 301 and the second light source mounting part 302. In addition, the third light source mounting part 303 may be connected to the heat dissipation region 350. In other words, the third light source mounting part 303 may be understood as a bridge connecting the inner heat dissipation region 351 and the outer heat dissipation region 352 to each other. That is, the heat dissipation region 350 may be provided as a single body.

According to the above-described configuration, the heat dissipation region 350 can more efficiently transfer heat generated from the light source 11 to the heat sink 120.

The conductive layer 60 may be provided on the insulating layer 20 and the conductive layer 40. However, the protective layer 60 may be provided such that the light source region 300 having the light source 11 mounted therein is opened. The protective layer may be provided on only a portion of the conductive layer 40. However, the present disclosure is not limited to the above-described configuration. In this embodiment, it will be described that the protective layer 60 is provided on the insulating layer 20 and the conductive layer 40, and only the light source region 300 is opened.

The protective layer 60 may include a reflective material. Specifically, the protective layer 60 may be disposed relatively downward of the light source 11. Thus, the protective layer 60 can serve as a reflective layer reflecting light emitted from the light source 11. For example, the reflective material may include a white or silver material, a reflective silicon material, a silicon white reflector material, a silicon white reflective material, etc. The reflective material may be provided as a material that has high heat-proof characteristic and high optical stability.

According to the above-described configuration, the protective layer 60 can have excellent reflectivity with respect to light emitted from the light source 11. That is, it is possible to obtain high optical efficiency through the protective layer 60.

Meanwhile, the protective layer 60 may become a medium on which characters 400 can be printed. Specifically, the characters 400 can be easily provided to the light source module 100 through an etching process the top surface of the protective layer 60 or a printing process of applying an inert ink on the top surface of the protective layer 60. That is, the protective layer 60 becomes the medium capable of providing the characters 400, so that it is possible to prevent damage of the insulating layer 20 or the conductive layer 40.

Figure 18:
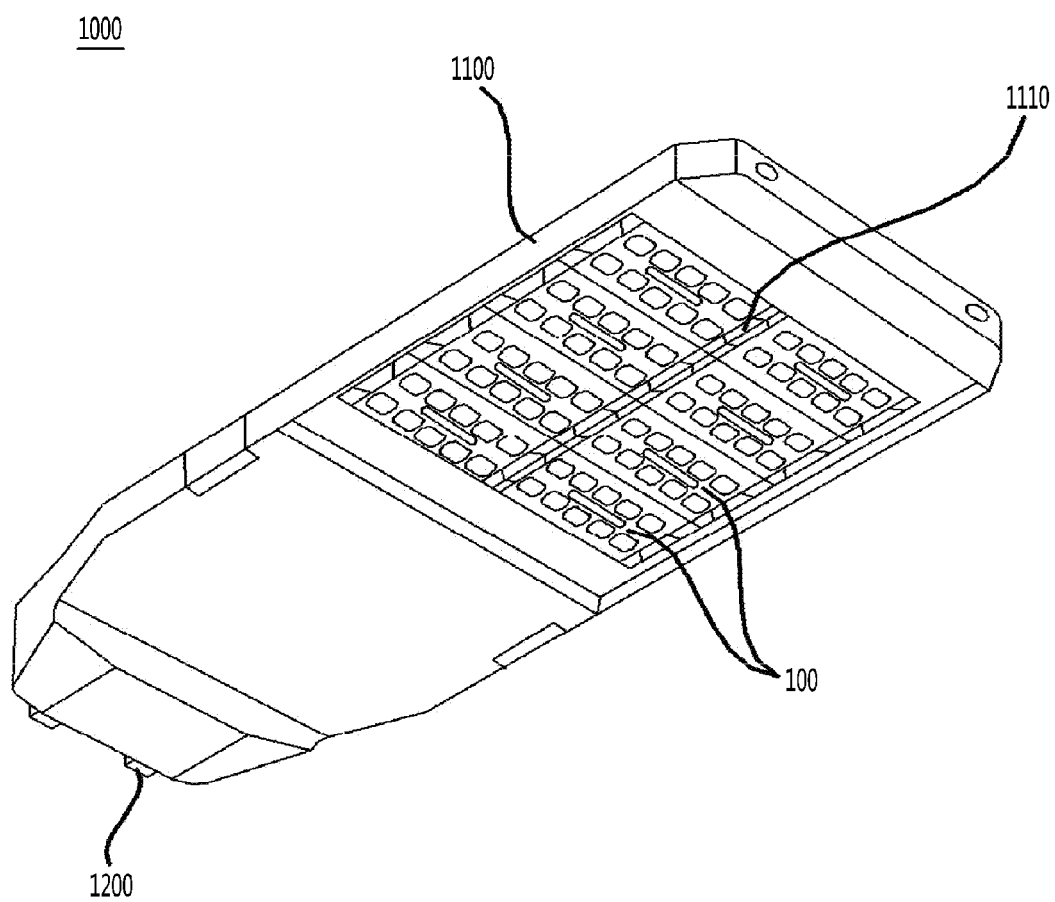
FIG. 18 is a perspective view of a lighting device including light source modules according to an embodiment.

FIG. 18 is a perspective view of a lighting device including light source modules according to an embodiment.

Referring to FIG. 18, the lighting device 1000 according to the embodiment may include a main body 1100 providing a space in which lighting modules 100 are coupled thereto, the main body 1100 forming an external appearance, and a connection part 1200 having a built-in power source (not shown) coupled to one side of the main body 1100 to supply power, the connection part 1200 connecting the main body 1100 to a supporting part (not shown). The lighting device 1000 according to the embodiment may be installed indoors or outdoors. For example, the lighting device 1000 according to the embodiment may be used as a streetlight. The main body 1100 may be provided with a plurality of frames 1110 capable of providing a space in which at least two light source modules 100 are positioned. The connection part 1200 has the power source (not shown) built therein and connects the main body 1100 to the supporting part (not shown) fixing the main body 1100 to the outside.

If the lighting device 1000 according to the embodiment is used, heat generated from the light source modules 100 can be effectively cooled due to a chimney effect. Further, a separate fan is not used, and thus fabrication cost can be reduced.

According to the present disclosure, due to effects such as rapid fabrication processes, inexpensive fabrication cost, facilitation of mass production, and improvement of product yield, many advantages can be expected in the production of lighting devices.

Particularly, products can be inexpensively fabricated at high speed. Thus, it is possible to promote the spread of lighting devices using light emitting diodes.

According to the present disclosure, the composition and disposition of a conductive material applying electric current to light sources are optimized, so that it is possible to reduce fabrication cost and to obtain stabilized operations. Thus, the present disclosure can be used in various application fields including medical science, sterilization, spectral analysis, and the like, as well as lighting.

According to the present disclosure, a protective layer is provided in a connection region through which electric current is supplied to the light source, so that it is possible to protect a conductive layer from a foreign substance or water drop penetrating from the outside and to prevent the conductive layer from being oxidized due to contact with air.

Also, the protective layer includes a reflective material, so that light emitted from the light source can be reflected from the protective layer, thereby improving the efficiency of the light source.

According to the present disclosure, a heat dissipation region is further provided to transfer heat generated from the light source to the heat sink, so that heat generated from the light source can be diffused to the entire heat sink, thereby improving the heat dissipation efficiency of the light source module.

According to the present disclosure, an insulating layer is stacked on the heat sink by a powder coating technique, a bottom surface recessed through a laser process is provided in the insulating layer, and a plating layer is provided on the recessed bottom surface. Thus, a process that has inexpensive fabrication cost and is suitable for mass production can be performed without using any high-priced printed circuit board and thermal pad. Accordingly, the light source module can be rapidly fabricated.

Furthermore, it is possible to obtain various effects that can be understood through configurations described in the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light source module comprising:
   at least one light source configured to emit light;
   a heat sink supporting the light source on a top surface thereof, the heat sink configured to absorb heat from the light source and dissipate the heat to the outside;
   an electrically insulating layer applied to at least one surface of the heat sink;
   a conductive layer provided on the insulating layer, the conductive layer comprising:
      connection regions through which electric current is supplied to the light source; and
      a light source region disposed between two of the connection regions, the light source region having the light source mounted therein; and
   a protective layer applied over the connection regions,
   wherein the conductive layer is provide on a metal junction face processed on the insulating layer, and
   wherein the metal junction face has at least one of a metal core, a rough surface, and a trench.

2. The light source module according to claim 1, wherein the light source region comprises a light source mounting part providing a positive electric current and negative electric current to the light source.

3. The light source module according to claim 1, wherein the conductive layer further comprises a heat dissipation region for transferring heat generated from the light source to the heat sink.

4. The light source module according to claim 3, wherein the heat dissipation region comprises:
   an inner heat dissipation region provided inside the light source region and the connection region;
   an outer heat dissipation region provided outside the light source region and the connection region; and
   a bridge connecting the inner heat dissipation region and the outer heat dissipation region to each other.

5. The light source module according to claim 3, wherein the protective layer is applied to the heat dissipation region.

6. The light source module according to claim 1, wherein the protective layer is applied to the insulating layer.

7. The light source module according to claim 1, wherein the protective layer comprises a reflective material.

8. The light source module according to claim 1, wherein the heat sink further comprises:
   a heat dissipation fin provided on a bottom surface of the heat sink, the heat dissipation fin dissipating heat to the outside; and
   an air hole passing through the heat sink.

9. The light source module according to claim 1, wherein the conductive layer is provided in a single layer made of a metal selected from the group consisting of copper and nickel.

10. The light source module according to claim 1, wherein the conductive layer is provided by plating, in multiple layers, the same metal or different metals, selected from the group consisting of copper and nickel.

11. The light source module according to claim 10, wherein copper is provided at a lower portion of the conductive layer, and nickel is provided at an upper portion of the conductive layer.

12. The light source module according to claim 1, wherein the protective layer is provided with a solder resist.

13. A lighting device using the light source module according to claim 1.

14. A light source module comprising:
   at least one light source configured to emit light;
   a heat sink supporting the light source on a top surface thereof, the heat sink configured to absorb heat from the light source and dissipate the heat to the outside;
   an electrically insulating part provided on at least one surface of the heat sink;
   a conducting part provided on the insulating part, the conducting part having a light source region in which the light source is placed; and
   a protecting part provided on the insulating part and the conducting part,
   wherein the protecting part is provided such that at least a portion of the light source region is exposed,
   wherein the conducting part is provide on a metal function face processed on the insulating part, and
   wherein the metal junction face has at least one of a metal core, a rough surface, and a trench.

15. The light source module according to claim 14, wherein the light source region comprises a light source mounting part providing a positive electric current and negative electric current to the light source.

16. The light source module according to claim 14, wherein the protective layer comprises a reflective material.

17. The light source module according to claim 14, wherein the insulating part comprises an electrically insulating layer applied to at least one surface of the heat sink, and wherein the conducting part comprises a conductive layer applied to at least one portion of the insulating layer.

18. A lighting device using the light source module according to claim 14.

19. A method for fabricating a light source module, the method comprising:

providing a light source;

providing a heat sink to support the light source;

applying an electrically insulating layer made of a resin material on at least one surface of the heat sink;

providing a recess part having a metal junction face in the insulating layer;

providing a conductive layer in the recess part;

applying a protective layer on the conductive layer; and bonding the light source to the conductive layer, wherein the metal junction face has at least one of a metal core, a rough surface, and a trench.

20. The method according to claim 19, wherein the insulating layer is applied on the entire surface of the heat sink.

\* \* \* \* \*